(12) United States Patent
Castro et al.

(10) Patent No.: US 9,129,955 B2
(45) Date of Patent: Sep. 8, 2015

(54) SEMICONDUCTOR FLIP-CHIP SYSTEM HAVING OBLONG CONNECTORS AND REDUCED TRACE PITCHES

(75) Inventors: Abram M. Castro, Fort Worth, TX (US); Mark A. Gerber, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1380 days.

(21) Appl. No.: 12/503,553

(22) Filed: Jul. 15, 2009

(65) Prior Publication Data

US 2010/0193944 A1    Aug. 5, 2010

Related U.S. Application Data

(60) Provisional application No. 61/149,940, filed on Feb. 4, 2009.

(51) Int. Cl.
     *H01L 23/498*      (2006.01)
     *H01L 23/00*      (2006.01)

(52) U.S. Cl.
CPC .......... *H01L 23/49811* (2013.01); *H01L 24/06* (2013.01); *H01L 24/13* (2013.01); *H01L 24/14* (2013.01); *H01L 24/16* (2013.01); *H01L 2224/0401* (2013.01); *H01L 2224/13012* (2013.01); *H01L 2224/13147* (2013.01); *H01L 2924/00013* (2013.01); *H01L 2924/014* (2013.01); *H01L 2924/01013* (2013.01); *H01L 2924/01014* (2013.01); *H01L 2924/01029* (2013.01); *H01L 2924/01033* (2013.01); *H01L 2924/01046* (2013.01); *H01L 2924/01078* (2013.01); *H01L 2924/01079* (2013.01); *H01L 2924/01082* (2013.01); *H01L 2924/14* (2013.01)

(58) Field of Classification Search
USPC ................ 257/668, 724, 778, 779, 780, 786, 257/E23.02, E23.069; 438/106–109
See application file for complete search history.

(56) References Cited

U.S. PATENT DOCUMENTS

| | | | | |
|---|---|---|---|---|
| 5,468,999 | A * | 11/1995 | Lin et al. ........................ | 257/784 |
| 5,767,570 | A * | 6/1998 | Rostoker ........................ | 257/668 |
| 5,914,536 | A * | 6/1999 | Shizuki et al. ................ | 257/778 |
| 6,768,062 | B2 * | 7/2004 | Morimoto et al. ............ | 174/260 |
| 2006/0243483 | A1 * | 11/2006 | Kirby et al. ................... | 174/267 |
| 2007/0228549 | A1 * | 10/2007 | Hsu et al. ...................... | 257/698 |
| 2008/0098594 | A1 * | 5/2008 | Abbott ........................... | 29/827 |
| 2008/0111236 | A1 * | 5/2008 | Lee et al. ...................... | 257/738 |

* cited by examiner

*Primary Examiner* — Sheng Zhu
(74) *Attorney, Agent, or Firm* — Steven A. Shaw; Frank D. Cimino

(57) ABSTRACT

A semiconductor chip (102) assembled on a substrate (101). The substrate has a first surface (101a) including conductive traces (110), which have a first length (111) and a first width (112), the first width being uniform along the first length, and further a pitch (114) to respective adjacent traces. The semiconductor chip has a second surface (102a) including contact pads (121); the second surface faces the first surface spaced apart by a gap (130). A conductive pillar (140) contacts each contact pad; the pillar includes a metal core (141) and a solder body (142), which connects the core to the respective trace across the gap. The pillar core (141) has an oblong cross section of a second width (151) and a second length (152) greater than the second width. Trace pitch (141) is equal to or smaller than twice the second width (151). The trace pitch is equal to or smaller than the second length (152).

17 Claims, 4 Drawing Sheets

SEMICONDUCTOR FLIP-CHIP SYSTEM HAVING OBLONG CONNECTORS AND REDUCED TRACE PITCHES

FIELD OF THE INVENTION

The present invention is related in general to the field of semiconductor devices and processes, and more specifically to the structure and fabrication method of semiconductor chips with oblong pillar-shaped bumps designed for fine pitch interconnect and high stress tolerance.

DESCRIPTION OF RELATED ART

Electronic applications such as handheld telephones and other wireless products offer the customer an ever increasing number of features, while the sizes of the telephones and other products keep shrinking. As a consequence, there is an ongoing trend for the semiconductor devices inside these products to miniaturize the size of the devices while increasing the number of functional device terminals. The shrinking device dimensions at increasing terminal numbers translate into ever finer pitch of the interconnections used by these devices. Today, the preferred technology for interconnecting a semiconductor chip to a substrate is by forming metallic bumps on the chip, then to flip the chip and solder-attach it onto the substrate. Likewise, the preferred technology for interconnecting a packaged device to a board is by using solder balls for flip-attaching the device to the board.

An emerging option for fine-pitch flip-chip interconnect utilizes circular copper bumps plated onto the terminals (contact pads) of the semiconductor chip; the bumps are then connected with solder to the copper traces of the substrate. An advantage of this approach is the possibility to fabricate the copper bumps in a wafer-level process; the photoresist technology used in this process determines the aspect ratio (height and diameter) of the bumps. The minimum diameter achieved for the bumps is 25 µm. In order to solder attach these bumps to the substrate traces and still provide a trace pitch centerline-to-centerline of 40 µm, adjacent substrate traces are constructed in a castellated outline: The portion of each trace acting as a bump contact pad (so-called flip-chip capture pad) widens to a width of 18 µm, while the remainder of the trace length has a narrow width of 10 µm; adjacent traces are then arranged in an alternating (staggered) fashion so that the wide portion of one trace is placed between the narrow portions of the two adjacent traces. This arrangement is sometimes referred to as neckdown. The pitch of the staggered capture pads is 80 µm.

Reliability stress tests by temperature cycling of devices with solder-attached copper bumps have shown that the contact area of a 25 µm diameter bumps soldered onto a 18 µm pad is both needed and sufficient to avoid cracks in the solder joint.

SUMMARY OF THE INVENTION

The ongoing market trend of semiconductor products for higher numbers of input/output terminals at reduced product sizes demands substrate trace pitches centerline-to-centerline considerably smaller than the presently achievable 40 µm, and further reliable flip-chip contacts to these fine-pitch traces. Applicants realized that for the bumps with circular cross sections, as presently employed for flip-chip assembly, only a segment of the circular cross section is utilized for actual contact to the trace, while the rest is overhang over the trace outline. Applicants discovered that by capillary action, this overhang may pull in so much liquid solder that the solder may protrude from the overhang and thus cause a short to the fine-pitch adjacent trace.

Applicants solved the problem of risking shorts between fine-pitch adjacent substrate traces during the solder reflow phase in the bump attachment process by selecting an oblong cross section for the bumps, with the long axis (for instance, 40 to 50 µm) in line with the trace and the short axis (for instance, 20 to 25 µm) about equal to the trace width. In this solution, the actual contact between bump and trace is about equal to the bump cross section, with only negligible overhang. The lack of overhang means an absence of capillary action for the liquid solder and thus a lack of solder spilling; the risk of a short to the adjacent trace is minimized. This, in turn, means that the pitch between traces can safely shrink, for instance, to 30 µm. Furthermore, since the oblong bump cross section makes the circular cross section obsolete, the traces may feature straight outlines and avoid the present castellated (neckdown) contours. The positioning of the pillars may remain staggered, but the pitch can also shrink (for instance, to 60 µm).

Applicant further discovered that oblong bump cross sections allow the enlargement of the actual flip-chip capture areas; enlarged solder joints, in turn, enhance the robustness of the solder joints against thermo-mechanical stress. The solder can be applied to the tip of the pillar rather than as a layer plated to the trace. In addition, the enlarged cross sectional area of oblong bumps provides an improved aspect ratio of height versus width in the photoresist process for fabricating the copper bumps, leading to a stretching of the bumps into actual pillars. These pillars, in turn, allow to widen the gap between chip and substrate so that it becomes easier to distribute a polymer precursor throughout the gap and to fill the spacing free of voids with stress-absorbing underfill material.

BRIEF DESCRIPTION OF THE DRAWINGS

FIG. 5B includes two cutaway sections: One section cuts into the solder; the other section cuts into the solder and the trace.

DETAILED DESCRIPTION OF THE PREFERRED EMBODIMENTS

Figure 1:
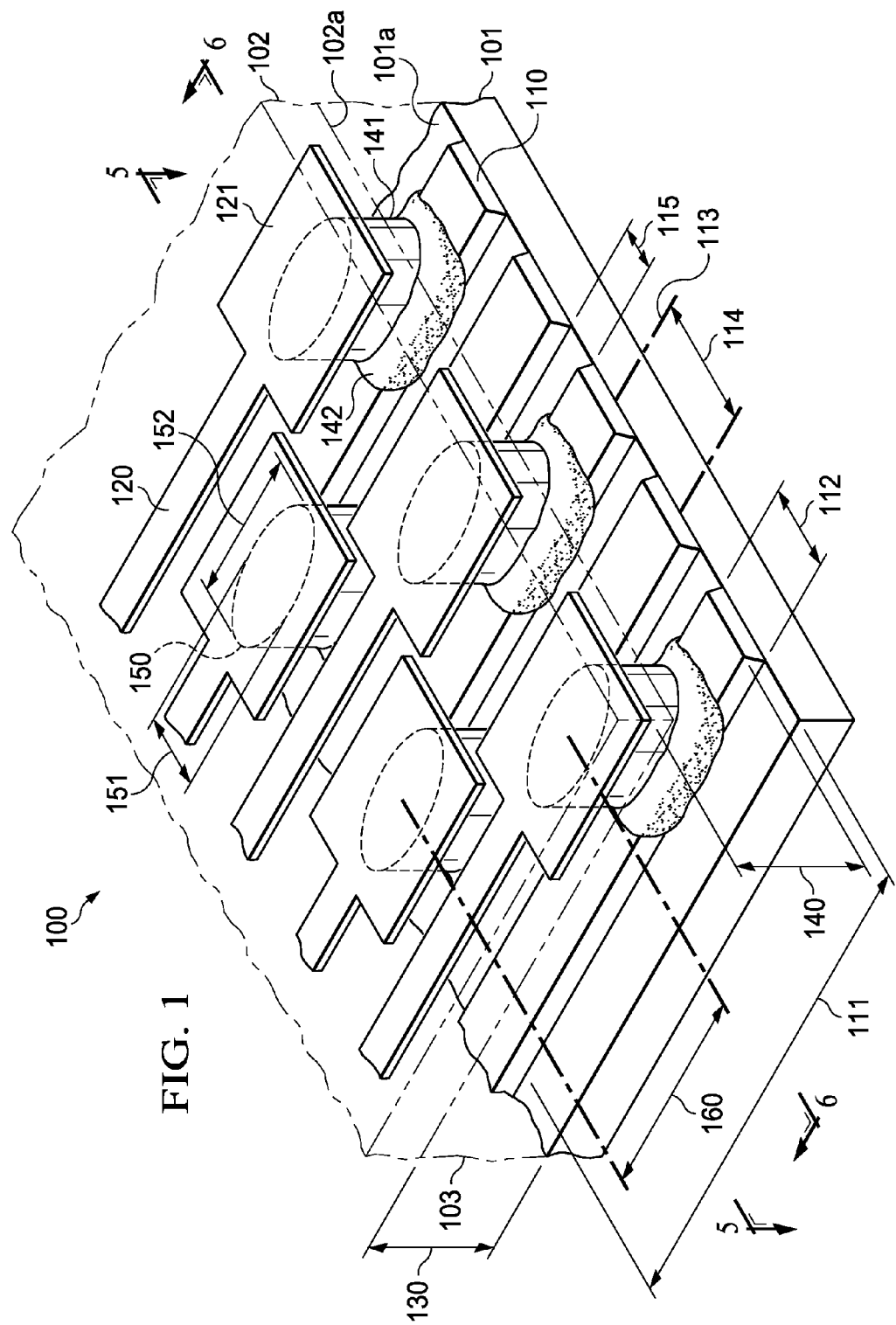
FIG. 1 is a schematic perspective view of an exemplary embodiment of the invention comprising a semiconductor chip (shown to be transparent) with staggered contact pads connected by pillars with oblong cross section and solder bodies to straight traces on a substrate. The section lines marked 5 and 6 refer to the FIGS. 5A, 5B, and FIGS. 6A, 6B, respectively.

FIG. 1 illustrates an exemplary embodiment of the invention, generally designated 100, which includes a semiconductor chip 102 assembled by flip-chip methodology on an insulating substrate 101. The substrate has a first surface 101a and a plurality of conductive traces 110. These traces may be placed on the substrate surface, as shown in FIG. 1, or may be level with the substrate surface. As FIG. 1 indicates, traces 110 have a first length 111, which is sufficient to accommodate the attachment of the connections to the chip 102; in FIG. 1, the attachments are positioned in a staggered arrangement relative to each other. For the extent of first length 111, the traces 110 are straight and parallel to each other. Traces 110 have a first width 112, which is uniform along first length 111. For the straight length, each trace 110 has a centerline 113. The distance between two adjacent trace centerlines determines the trace pitch 114. For the plurality of traces 110 shown in FIG. 1, adjacent traces 110 have identical pitch 114. The distance between adjacent traces is designated 115.

In the preferred embodiments, the first width 112 is between about 15 and 30 μm, and the pitch 114 centerline-to-centerline between about 30 and 50 μm. The trend for substrates in semiconductor technology is towards smaller widths and smaller pitches.

For clarity reasons, the semiconductor material of chip 102 is shown transparent in FIG. 1 so that the chip outlines are indicated by dashed contours, while the metallic interconnections on the chip surface, including lines 120 and contact pads 121, are shown in solid contours. The chip surface is referred to as the second surface 102a. As the embodiment of FIG. 1 illustrates, the first surface 101a faces the second surface 102a, and the surfaces 101a and 102a are spaced apart by a gap designated 130. The metallic lines 120 and contact pads 121 may be placed on the chip surface or may be level with the chip surface.

The relentless push to increase the number of contact pads as chip input/output terminals, while keeping the chip size constant or even decreasing, is the reason for arranging the contact pads 121 in a staggered fashion. The pitch center-to-center of adjacent, staggered contact pads 121 is designated 160.

In FIG. 1, the connections between substrate 101 and chip 102 are conductive pillars of a height 140. Following the staggered arrangement of the contact pads 121, the pillars 140 are arranged in an identical staggered array. Each pillar is composed of a metal core 141 in contact with a chip pad 121, and a solder body 142 connecting the core to the respective trace 110 across gap 130. Preferably, the metal core 141 of the pillar is made of copper or a copper alloy. As FIG. 1 illustrates, the pillar core 141 has an oblong cross section 150 including a second width 151 and a second length 152. Second length 152 is greater than second width 151. In the preferred embodiment, the copper of pillar core 141 is plated onto the metal of chip pad 121 during the wafer processing flow.

Figure 2:
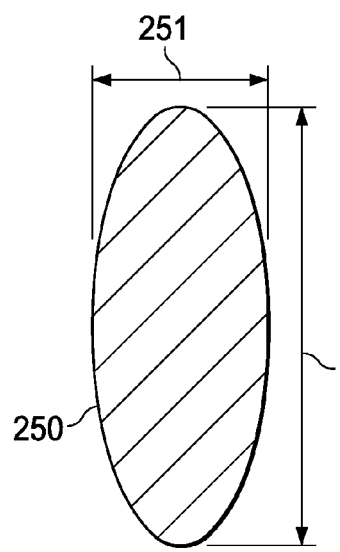
FIG. 2 is a schematic cross section of a pillar, the cross section having an oval/elliptical outline.
Figure 3:
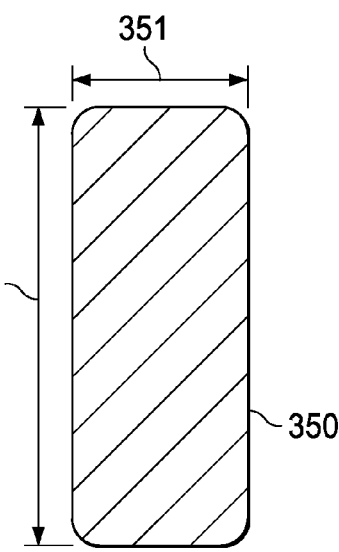
FIG. 3 is a schematic cross section of a pillar, the cross section having a rectangular outline.
Figure 4:
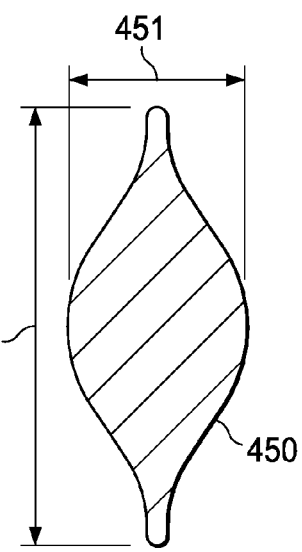
FIG. 4 is a schematic cross section of a pillar, the cross section having a football-shaped outline

A few exemplary oblong cross sections 150 of pillar cores are depicted in FIGS. 2 to 4. In FIG. 2, cross section 250 has an outline shaped as an oval or an ellipse with a second width 251 and a second length 252 greater than second width 251. In FIG. 3, cross section 350 has an outline shaped as a rectangle with a second width 351 and a second length 352 greater than second width 351. In FIG. 4, cross section 450 has an outline resembling an American football with a second width 451 and a second length 452 greater than second width 451. For semiconductor products manufactured with pillar core cross sections like the ones depicted in FIGS. 2 to 4, second widths are in the range from about 20 to 25 μm, but are shrinking, and second lengths are preferably in the range from about 40 to 50 μm. In these products, the oblong cross sections of the pillar cores preferably have an area at least twice the area of a circle with a diameter of the second width (251, 351, 451 respectively).

When pillars have cross sectional areas of this magnitude, the solder joints have been found to be robust against thermomechanical stress and against developing failures by microcracks. Another advantage of generous pillar cross sectional area is that the correct amount of solder for the joints can be pre-deposited (for instance by plating) on the tips of the copper pillars before the chip is flipped onto the substrate in the assembly process. At the reflow temperature, the solder is wetting the respective trace (as illustrated in FIG. 1) but without the possibility of spreading out and causing a short to an adjacent trace.

Referring to FIG. 1, in order to place the oblong pillars with the second width 151 on the substrate traces having the first width 112, while allowing for a manufacturing process window, the second width 151 should have a size less than 1.2 times the first width 112; preferably, second width 151 may be about equal to the trace width 112, or even slightly less than trace width 112.

Also included in the embodiment of the invention shown in FIG. 1 is a polymeric compound 103 filling the gap 130 between the first surface 101a and the second surface 102a. For clarity reasons, compound 103 is shown transparent in FIG. 1. The compound surrounds the cores 141 and the solder bodies 142 of the pillars and serves to absorb and mitigate thermomechanical stress on the solder joints.

Figure 5A:
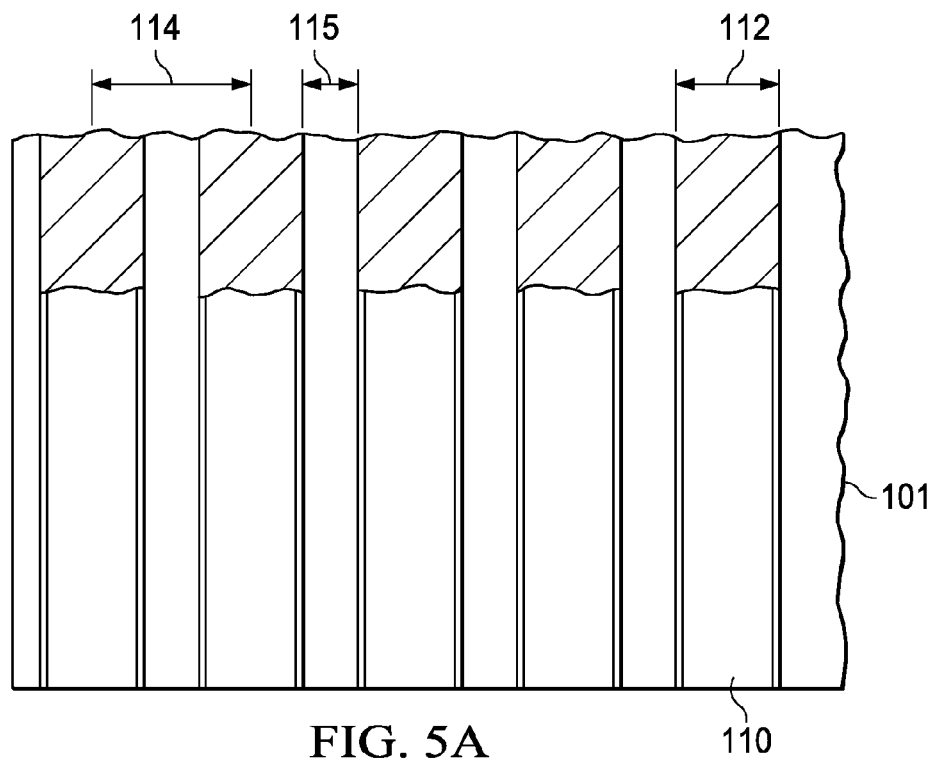
FIG. 5A is a schematic top view of the traces on the substrate shown in FIG. 1 without the reflowed solder. Portions of the traces are depicted in cutaway view.
Figure 6A:
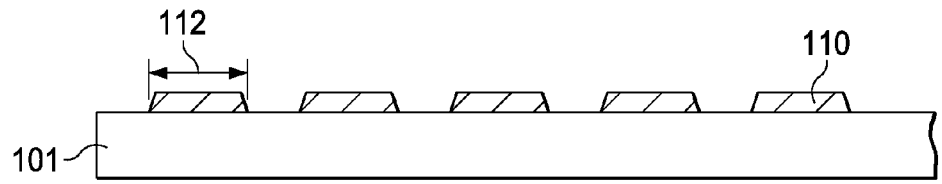
FIG. 6A is a schematic cross section of the traces on the substrate, as shown in FIG. 1, without the attached pillars.

The plurality of the traces in FIG. 1 is viewed from top in FIG. 5A, partially as a cutaway, with the designation numbers referring to identical items. The plurality of the traces is viewed as a cross section in FIG. 6A. The first width 112 is the effective, i.e. total width of the trace; it was stated above that first width 112 is uniform over the trace length shown and has the same value for all traces of the depicted plurality. Preferably, traces 112 include a bulk metal, preferably copper or a copper alloy, which has a surface with affinity for solder wetting. Solderability of the trace surface can be accomplished, for instance, by an un-oxidized copper surface, or by an additional metal layer over the copper surface such as a layer of nickel (thickness between about 0.5 and 2.0 μm) in contact with the copper followed by an outermost layer of a noble metal such as palladium (thickness about 0.1 μm or less), or gold (thickness about 0.009 m or less), or both a palladium layer and a gold layer.

Figure 6B:
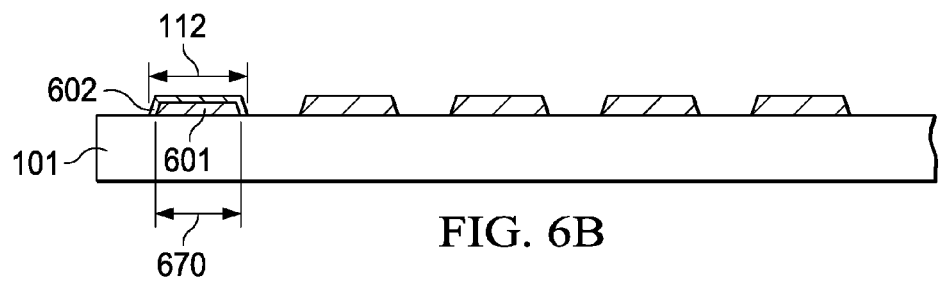
FIG. 6B is a schematic cross section of the traces on the substrate, as shown in FIG. 1, when the traces comprise a bulk metal as core covered by a layer of solderable metal, such as a layer of solder.

As shown in FIG. 6B, the trace bulk metal 601 (for example, copper) may alternatively be preplated with a layer 602 of solder. In this case, the preferred thickness of layer 602 is between about 4 and 7 μm. Since the solder 602 is plated on all exposed sides of bulk metal 601, and the total (first) width 112 has to be kept within the 15 to 30 μm limit, the width 670 of the bulk metal is in the 10 to 20 μm range.

Figure 5B:
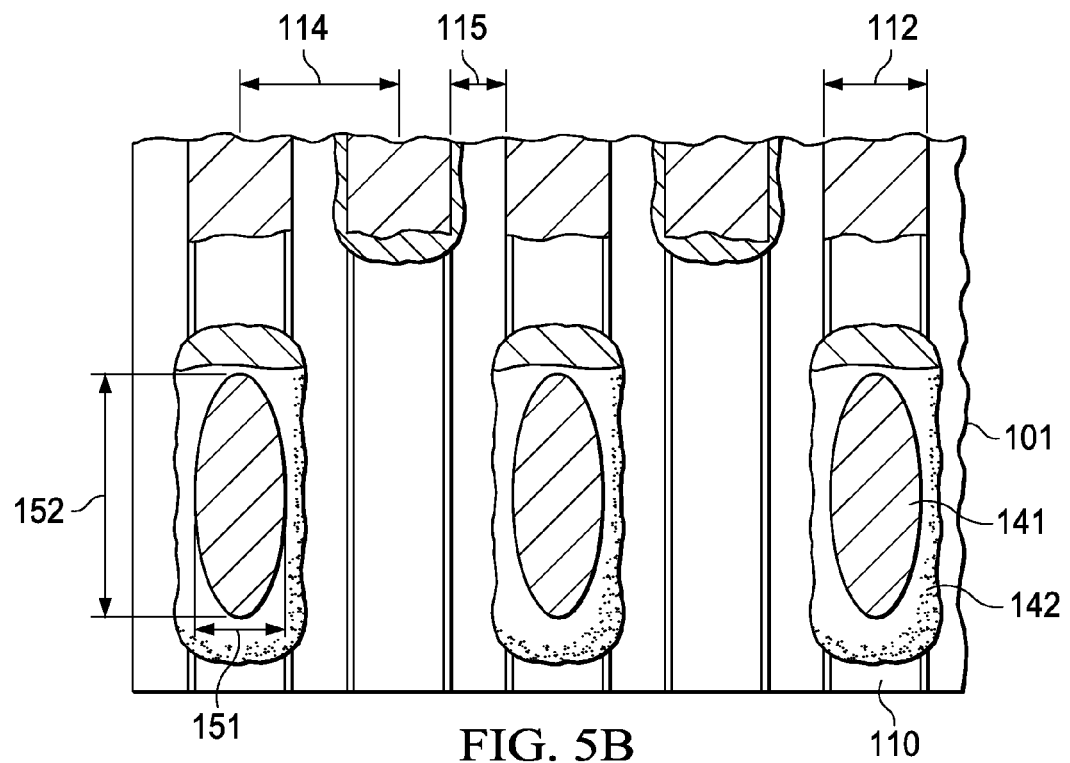
FIG. 5B is a schematic top view of the traces on the substrate shown in FIG. 1 with the reflowed solder and a cross section through the attached pillars.

Referring to FIG. 5B, the top view is a composite depiction of the traces 110 on substrate 101 and a cross section through the oblong pillars 141 connecting the chip with the substrate and attached to traces 110 by reflowed solder bodies 142 (portions of the solder are shown in cutaway view). In analogy to the arrangement in FIG. 1, the attached pillars are arranged in staggered positions. As FIG. 5B illustrates, in a preferred embodiment the trace pitch 114 is equal to or smaller than twice the second width 151 of the pillar. Since the miniaturization trend of the technology drives shrinking trace pitches, the pillar width 151 of the preferred embodiment will be reduced rather than allowed to overhang over the trace width 112 (first width).

In order to maintain the pillar contact area, the compensation for the slimmer pillar width comes from an extension of the pillar length (second length), up to the size limit of the chip pad 121, onto which pillar core 141 has been attached by the plating. As a consequence, also shown in FIG. 5B, the correlation between the trace pitch and the length of the oblong pillar in the preferred embodiment is that the trace pitch 114 is equal to or smaller than the second length 152. As an example, for a trace pitch of 30 µm, composed of a first width 112 of 17 µm and a trace distance 115 of 13 µm, the pillar core 141 has an oval shape of second width 151 of 20 µm and second length 152 of 45 µm. The side length of the square-shaped chip pad 121 is 55 µm, and the pitch 160 center-to-center of adjacent, staggered chip pads 121 is 80 µm.

Figure 6C:
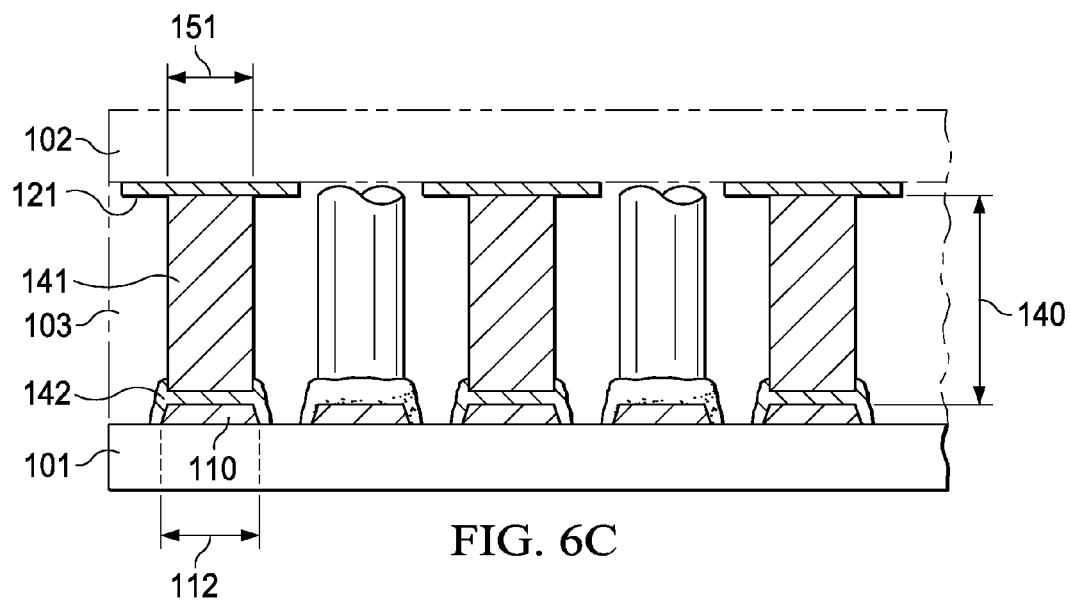
FIG. 6C is a schematic side view and cross section of the embodiment as shown in FIG. 1, with the pillars attached to the traces.

Creating a cross section along the marked 6 in FIG. 1 results in the side view of the embodiment depicted in FIG. 6C; for clarity reasons, chip 102 and polymeric underfill 103 are assumed to be transparent, while substrate 101 is shown in solid outlines. The copper pillars 141 on the copper pads 121 of the chip are assembled by solder bodies 142 on the respective copper traces 110 of substrate 101. First width (of the trace) 112 and second width (of the oblong pillar) 151 have the same designations as in FIG. 1.

As FIG. 6C illustrates, in the preferred embodiment of the invention, the pillar height 140 is at least twice the second width 151. When the second width is narrow, as needed for substrates with small trace pitches, the preferred embodiment has a pillar height 140 at least equal to the second length 152 of the oblong pillar. Since the copper pillars are plated while the chips are still in the wafer process flow, the aspect ratios of these pillar heights 140 are readily achievable. Large pillar heights 140 allow a process for underfilling the gap of the assembled chip-on-substrate with a polymeric precursor, which is quick, complete, and produces an underfill free of voids.

The mutual relationships of trace pitch, oblong pillar cross section, pillar contact area, and pillar height lend themselves to scaling towards finer pitch with larger contact area, to void-free underlining, and to solder joints robust against thermomechanical stress. In addition, the plating of pillars with oblong cross sections onto the chip pads, which are usually made of aluminum or copper, occupy a substantial amount of the pad area and thus reduce any reliability risk to unoccupied pad areas.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type and any number of semiconductor chips, discrete or integrated circuits; it further applies to combinations of active and passive components, and to any material of the semiconductor chips including silicon, silicon germanium, gallium arsenide, or any other semiconductor or compound material used in semiconductor manufacturing. It is therefore intended that the appended claims encompass any such modifications or embodiment.

We claim:

1. An apparatus comprising:
   a substrate having a first surface including conductive traces, the traces
   having a first length and a first width, the first width being uniform along the first length, and further a pitch to respective adjacent traces;
   a semiconductor chip having a second surface including contact pads, the second surface facing the first surface spaced apart by a gap;
   a conductive pillar of a height on each contact pad, the pillar including a non-solder metal core and a solder body connecting the core to the respective trace across the gap;
   the pillar core having an oblong cross section across and perpendicular to the height and parallel to the second surface; and
   the oblong cross section having a second width and a second length greater than the second width and greater than the first width.

2. The apparatus of claim 1 wherein the outline of the pillar core oblong cross section is selected from a group including a rectangle, an ellipse, an oval, and a football.

3. The apparatus of claim 2, wherein the second width is equal to or less than about 1.2 times the first width.

4. The apparatus of claim 2, wherein the pillar core oblong cross section has an area at least twice the area of a circle with second width diameter.

5. The apparatus of claim 1 wherein the pillar height is at least twice the second width.

6. The apparatus of claim 1 wherein the pillar height is at least equal to the second length.

7. The apparatus of claim 1 wherein the metal core of the pillar is made of copper.

8. The apparatus of claim 1, wherein the trace pitch is equal to or smaller than twice the second width.

9. The apparatus of claim 1, wherein the trace pitch is equal to or smaller than the second length.

10. The apparatus of claim 1 wherein the traces include a bulk metal.

11. The apparatus of claim 10 wherein the bulk metal is copper.

12. The apparatus of claim 10 wherein the traces further include a metal layer covering the bulk metal, the metal layer being wettable by solder.

13. The apparatus of claim 12 wherein the metal layer is a stack of a nickel layer followed by an outermost noble metal layer.

14. The apparatus of claim 12 wherein the metal layer is a solder layer.

15. The apparatus of claim 1 further including a polymer compound surrounding the pillars and the solder, and filling the gap between the first and the second surface.

16. The apparatus of claim 1, in which the second length is aligned in parallel with the length of the first length of the traces.

17. The apparatus of claim 2, in which the contact pads are arranged in a staggered fashion.

* * * * *